United States Patent
Chen

(10) Patent No.: US 11,695,065 B2
(45) Date of Patent: Jul. 4, 2023

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Ze Chen, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 73 days.

(21) Appl. No.: 17/322,770

(22) Filed: May 17, 2021

(65) Prior Publication Data

US 2022/0059680 A1 Feb. 24, 2022

(30) Foreign Application Priority Data

Aug. 20, 2020 (JP) ................... 2020-139278

(51) Int. Cl.
| | | |
|---|---|---|
| *H01L 29/739* | (2006.01) | |
| *H01L 29/06* | (2006.01) | |
| *H01L 21/265* | (2006.01) | |
| *H01L 29/66* | (2006.01) | |

(52) U.S. Cl.
CPC ........ *H01L 29/7397* (2013.01); *H01L 21/265* (2013.01); *H01L 29/0615* (2013.01); *H01L 29/66348* (2013.01)

(58) Field of Classification Search
CPC ............. H01L 29/7397; H01L 29/0615; H01L 29/66348; H01L 21/265
USPC ....................................................... 257/139
See application file for complete search history.

(56) References Cited

U.S. PATENT DOCUMENTS

| | | | |
|---|---|---|---|
| 2005/0164476 A1 | 7/2005 | Schulze et al. | |
| 2016/0276469 A1* | 9/2016 | Machida | ................. H01L 29/36 |
| 2018/0019131 A1* | 1/2018 | Suzuki | .................. H01L 29/739 |
| 2018/0366566 A1 | 12/2018 | Suzuki et al. | |
| 2019/0103479 A1* | 4/2019 | Suzuki | ............. H01L 29/66333 |
| 2020/0273970 A1* | 8/2020 | Okuda | ................ H01L 21/2033 |
| 2021/0273053 A1* | 9/2021 | Suzuki | ................ H01L 29/0834 |

FOREIGN PATENT DOCUMENTS

| | | |
|---|---|---|
| DE | 103 61 134 A1 | 7/2005 |
| DE | 10 2018 205 274 A1 | 12/2018 |
| WO | 2016/147264 A1 | 9/2016 |

OTHER PUBLICATIONS

An Office Action mailed by the German Patent and Trade Mark Office dated Sep. 1, 2022, which corresponds to German Patent Application No. DE 10 2021 119 575.6.

* cited by examiner

*Primary Examiner* — Igwe U Anya
(74) *Attorney, Agent, or Firm* — Studebaker & Brackett PC

(57) ABSTRACT

Provided are a semiconductor device in which the lifetime of holes is controlled and the switching loss is suppressed, and a method of manufacturing the same. Provided are a semiconductor substrate having a drift layer of a first conductivity type between a first main surface and a second main surface opposite to the first main surface, a first buffer layer of the first conductivity type provided between the drift layer and the second main surface in contact with the drift layer, having a resistivity lower than that of the drift layer, and having an impurity concentration higher than that of the drift layer, and a high resistivity layer provided between the first buffer layer and the second main surface and having a resistivity higher than that of the drift layer.

19 Claims, 18 Drawing Sheets

F I G. 1
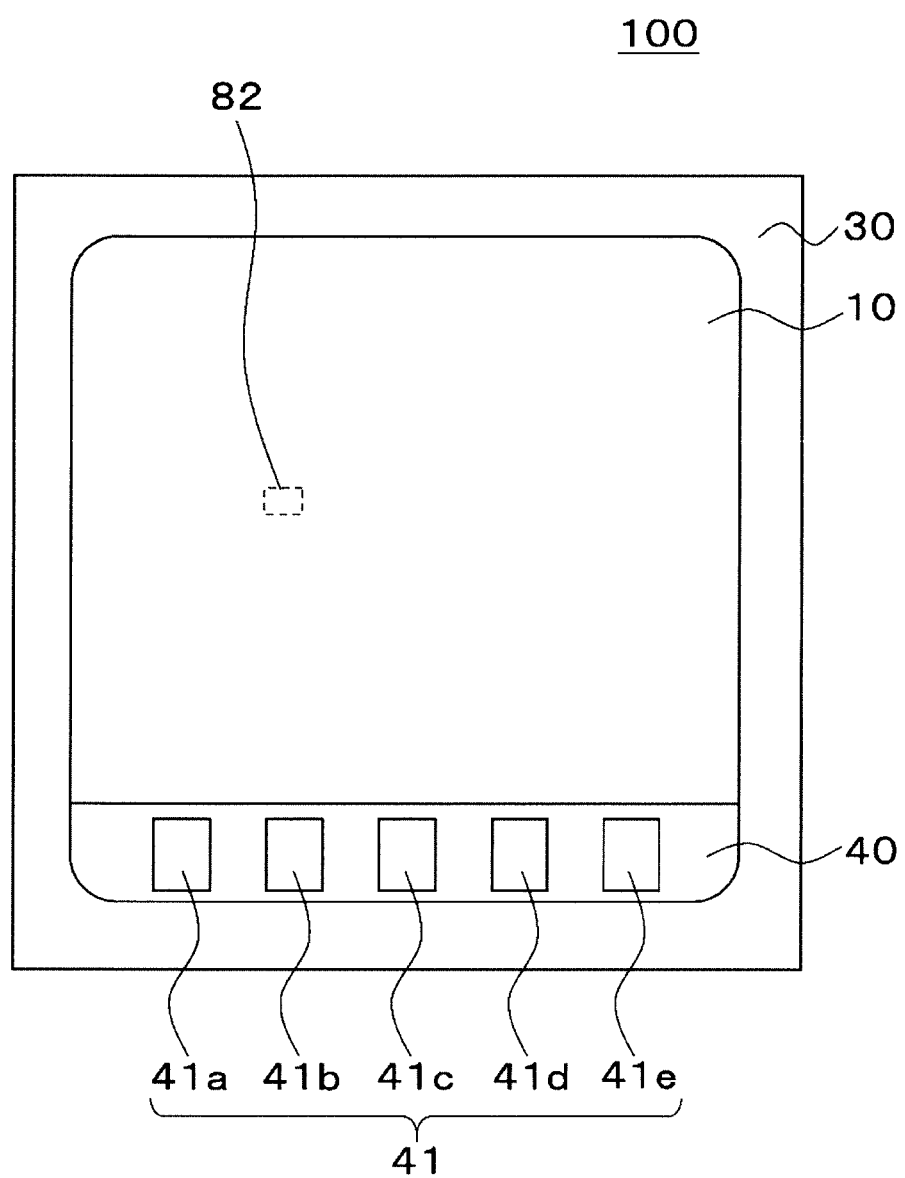

B-B CROSS SECTION

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

In recent years, from the viewpoint of energy saving, semiconductor devices having low energy loss have been required in the electric railway field, the in-vehicle field, the industrial machinery field, the consumer appliance field, and the like. For example, reduction in thickness of the semiconductor wafer is effective in suppressing the energy loss of the semiconductor device because the electric resistance is reduced by an amount of thinning. However, when the semiconductor wafer is made thin, the depletion layer is prone to reach the rear surface of the semiconductor wafer, resulting in a decrease in withstand voltage and an increase in leakage current. Therefore, International Publication No. 2016/147264 proposes a semiconductor device capable of gently stopping the depletion layer by forming a buffer layer having an impurity concentration higher than the drift layer on the rear surface side of the semiconductor wafer.

However, the semiconductor device in International Publication No. 2016/147264 has a problem that a switching loss occurs attributed to the lifetime of holes.

SUMMARY

The present disclosure has been made in view of the above problem and has an object to provide a semiconductor device in which the lifetime of holes is controlled and the switching loss is suppressed, and a method of manufacturing the same.

According to the present disclosure, a semiconductor device includes a semiconductor substrate having a drift layer of a first conductivity type between a first main surface and a second main surface opposite to the first main surface, a first buffer layer of the first conductive type provided between the drift layer and the second main surface in contact with the drift layer, having a resistivity lower than that of the drift layer, and having an impurity concentration higher than that of the drift layer, and a high resistivity layer provided between the first buffer layer and the second main surface and having a resistivity higher than that of the drift layer.

According to the present disclosure, the method of manufacturing the semiconductor device includes a step of preparing a semiconductor substrate having a drift layer of a first conductivity type between a first main surface and a second main surface opposite to the first main surface, a first implantation step of performing implantation of first conductivity type impurities into the semiconductor substrate in a depth direction from the second main surface toward the first main surface, and a heat treatment step of forming a first buffer layer having a resistivity lower than that of the drift layer by diffusing the first conductivity type impurities, and forming, between the first buffer layer and the second main surface, a high resistivity layer having a resistivity higher than that of the drift layer without diffusing the first conductivity type impurities.

The lifetime of holes is controlled and the switching loss is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view illustrating a semiconductor device according to Embodiment 1;

DESCRIPTION OF THE PREFERRED EMBODIMENTS

Figure 2:
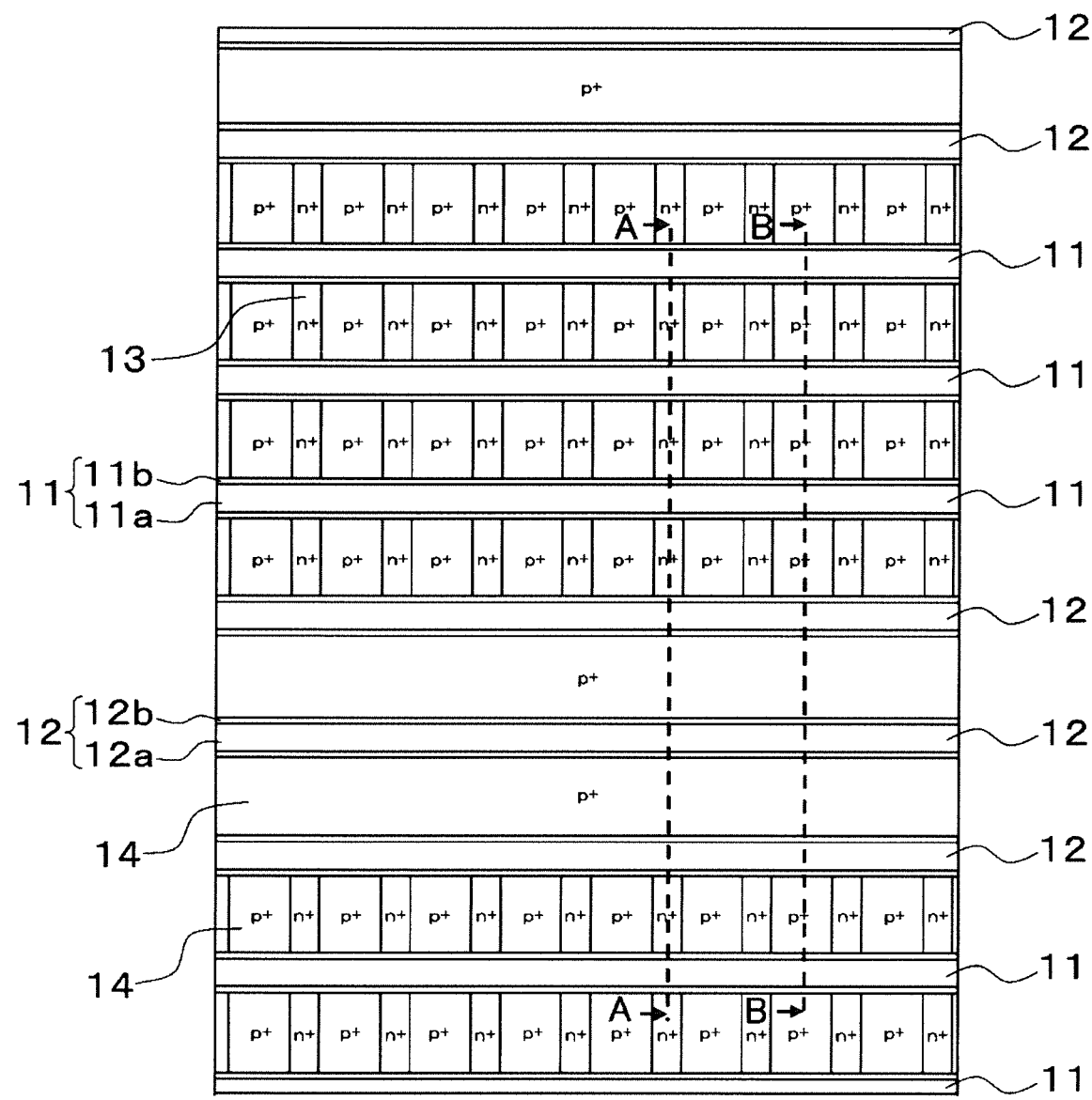
FIG. 2 is a partial enlarged plan view illustrating a configuration of a cell region of the semiconductor device according to Embodiment 1.

Hereinafter, Embodiments will be described with reference to the attached drawings. The drawings are schematically illustrated; therefore, the mutuality between sizes and positions can be changed. In the following description, the same or corresponding components may be given the same reference numerals and repeated description may be omitted.

Also, in the following description, even though terms indicating specific position and direction such as "upper", "lower" and "side" may be used, these terms are for promoting the understanding of the contents of Embodiments and are not for defining the position and the direction upon implementation.

Further, in the following description, n and p indicate the types of conductivity of the semiconductor, and in the present disclosure, the description is made that the first conductive type represents the n type and the second conductive type represents the p type. Further, n− indicates that the impurity concentration is lower than n, and n+ indicates that the impurity concentration is higher than n. Similarly, p− indicates that the impurity concentration is lower than p, and p+ indicates that the impurity concentration is higher than p.

Embodiment 1

FIG. 1 is a plan view illustrating a semiconductor device according to Embodiment 1, and illustrates a semiconductor device being an insulated gate bipolar transistor (IGBT).

As illustrated in FIG. 1, a pad region 40 is provided adjacent to a cell region 10. The pad region 40 is a region in which control pads 41 for controlling a semiconductor device 100 are provided. A terminal region 30 for holding the withstand voltage of the semiconductor device 100 is provided around the region where the cell region 10 and the pad region 40 are combined. A known withstand voltage holding structure may be appropriately selected and provided in the terminal region 30. For the withstand voltage holding structure, for example, a Field Limiting Ring (FLR) in which the cell region is surrounded by a p-type terminal well layer of a p-type semiconductor on a first main surface side being the front surface side of the semiconductor device 100, or a Variation of Lateral Doping (VLD) in which the cell region is surrounded by a p-type well layer with a concentration gradient may be adopted, in which the number of ring-shaped p-type terminal well layers used for FLR and the concentration gradient used for VLD may be selected depending on a withstand voltage design. Further, the p-type terminal well layer may be provided over almost the entire pad region 40, or the cell region may be provided in the pad region 40.

The control pads 41 may include, for example, a current sense pad 41a, a Kelvin emitter pad 41b, a gate pad 41c, and temperature sense diode pads 41d, 41e. The current sense pad 41a is a control pad for detecting the current flowing in the cell region of the semiconductor device 100, and is a control pad that is electrically connected to a part of the cell region so that a current of one several-th to one ten thousandth flowing in the entire cell region can flow when a current flows in the cell region of the semiconductor device 100.

The Kelvin emitter pad 41b and the gate pad 41c are control pads to which a gate drive voltage for on/off control of the semiconductor device 100 is applied. The Kelvin emitter pad 41b is electrically connected to the p-type base layer of the cell region 10, and the gate pad 41c is electrically connected to the gate trench electrode of the IGBT cell. The Kelvin emitter pad 41b and the p-type base layer may be electrically connected via a p+ type contact layer. The temperature sense diode pads 41d and 41e are control pads electrically connected to the anode and cathode of the temperature sense diode provided in the semiconductor device 100. The temperature of the semiconductor device 100 is measured by measuring the voltage between the anode and the cathode of a temperature sense diode (not illustrated) provided in the cell region.

Figure 3:
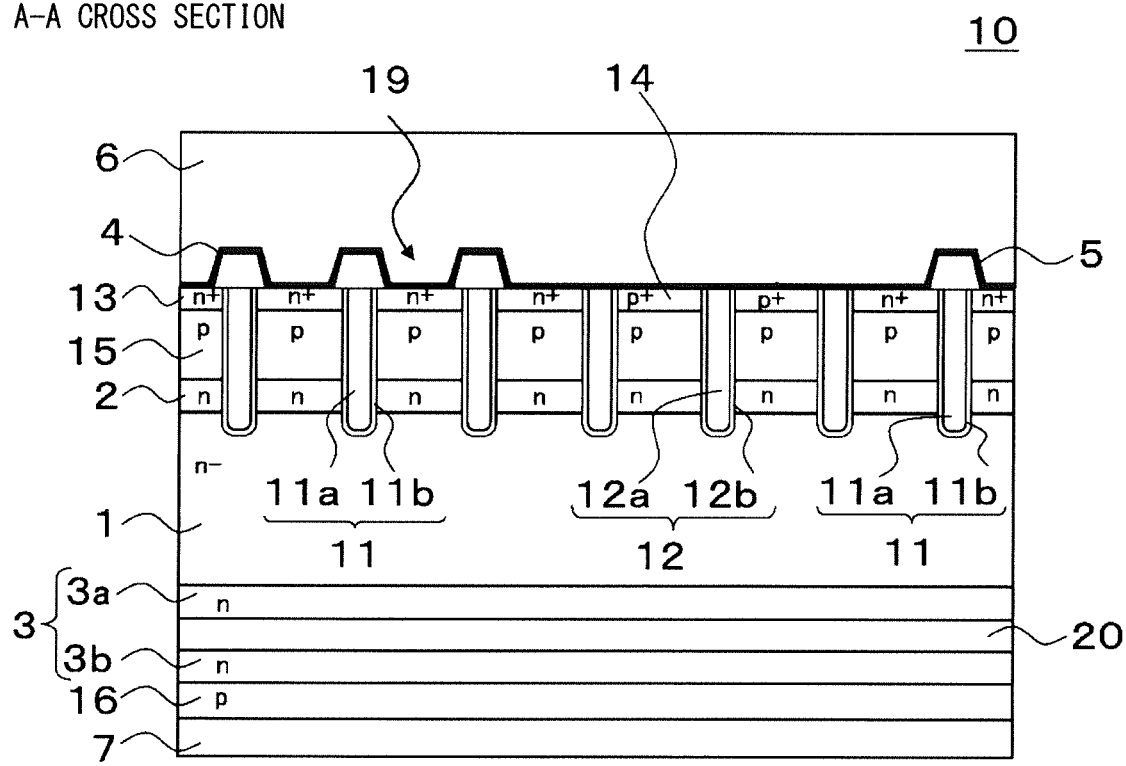
FIG. 3 is a cross-sectional view taken along the line A-A illustrating the configuration of the cell region of the semiconductor device according to Embodiment 1.
Figure 4:
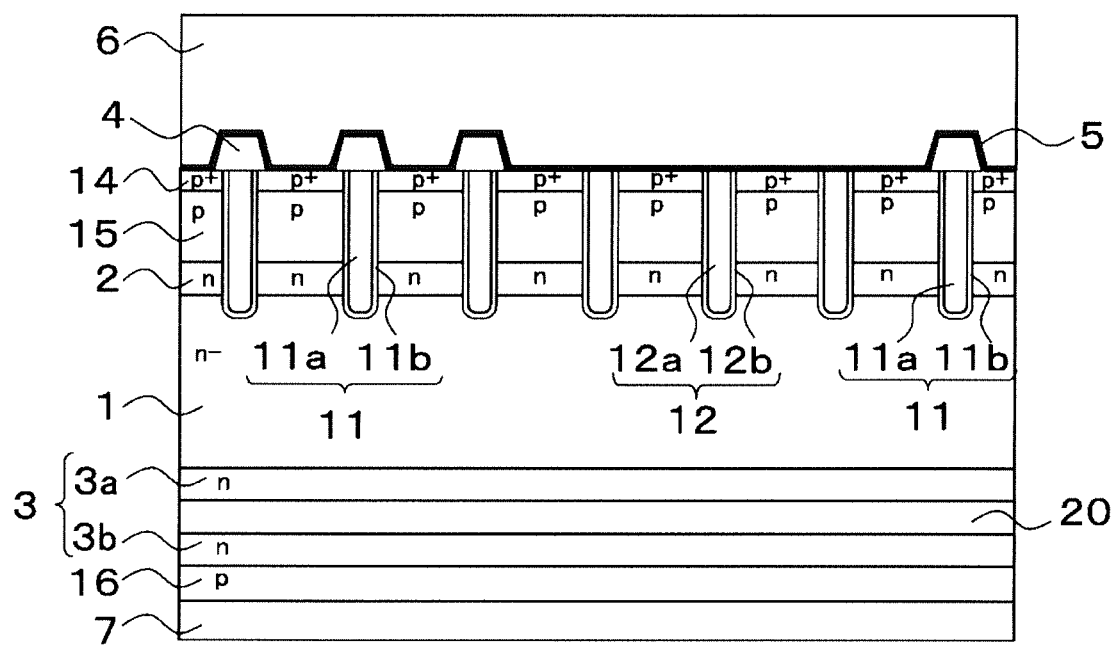
FIG. 4 is a cross-sectional view taken along the line B-B illustrating the configuration of the cell region of the semiconductor device according to Embodiment 1.

FIG. 2 is a partial enlarged plan view illustrating a configuration of the cell region of the semiconductor device according to Embodiment 1. FIGS. 3 and 4 are cross-sectional views illustrating a configuration of the cell region of the semiconductor device according to Embodiment 1. FIG. 2 is an enlarged view of the region surrounded by the broken line 82 in the semiconductor device 100 illustrated in FIG. 1. FIG. 3 is a cross-sectional view taken along the broken line A-A of the semiconductor device 100 illustrated in FIG. 2, and FIG. 4 is a cross-sectional view taken along the broken line B-B of the semiconductor device 100 illustrated in FIG. 2.

As illustrated in FIG. 2, the cell region 10 is provided with active trench gates 11 and dummy trench gates 12 in a striped pattern. An active trench gate 11 has a gate trench electrode 11a in a trench formed in a semiconductor substrate via a gate trench insulating film 11b. A dummy trench gate 12 has a dummy trench electrode 12a in a trench formed in the semiconductor substrate via a dummy trench insulating film 12b. The gate trench electrode 11a of the active trench gate 11 is electrically connected to the gate pad 41c. The dummy trench electrode 12a of the dummy trench gate 12 is electrically connected to an emitter electrode provided on a first main surface of the semiconductor device 100. That is, the active trench gate 11 applies the gate drive voltage, while the dummy trench gate 12 does not apply the gate drive voltage.

An n+ type layer 13 is provided in contact with the gate trench insulating film 11b on both sides of the active trench gate 11 in the width direction. The n+ type emitter layer 13 is arranged alternately with p+ type contact layer 14 along the extending direction of the active trench gate 11. A p+ type contact layer 14 is also provided between two adjacent dummy trench gates 12.

In FIG. 2, although the number of active trench gates 11 included in one set of active trench gates 11 is set to 3, the number thereof needs only be one or more. Also, the number of dummy trench gates 12 included in one set of dummy trench gates 12 may be one or more, and the number of dummy trench gates 12 may be zero. That is, all the trenches provided in the cell region 10 may be the active trench gates 11.

FIG. 3 is a cross-sectional view taken along line A-A of the semiconductor device 100 illustrated in FIG. 2. In FIG. 3, the semiconductor device 100 includes an n− type drift layer 1 consists of a semiconductor substrate. In FIG. 3, the semiconductor substrate ranges from the n+ type emitter layer 13 and the p+ type contact layer 14 to the p− type collector layer 16. In FIG. 3, the upper ends of the n+ type emitter layer 13 and the p+ type contact layer 14 in the sheet of drawing paper is referred to as a first main surface of the semiconductor substrate, and the lower end of the p− type collector layer 16 in the sheet of drawing paper is referred to as a second main surface of the semiconductor substrate. The first main surface of the semiconductor substrate is the main surface on the front surface side of the semiconductor device 100, and the second main surface of the semiconductor substrate is the main surface on the rear surface side of the semiconductor device 100. The semiconductor device 100 includes the n− type drift layer 1 between the first main surface and the second main surface opposite to the first main surface.

As illustrated in FIG. 3, the semiconductor device 100 is provided with an n-type carrier storage layer 2 having a higher concentration of n-type impurities than the n− type drift layer 1 on the first main surface side of the n− type drift layer 1. The semiconductor device 100 may not be provided with the n-type carrier storage layer 2, but may also be provided with the n− type drift layer 1 in the region of the n-type carrier storage layer 2 illustrated in FIG. 3. Providing the n-type carrier storage layer 2 ensures the suppression of the energization loss when a current flows through the semiconductor device 100. The n-type carrier storage layer 2 and the n− type drift layer 1 may be collectively referred to as a drift layer.

The n-type carrier storage layer 2 is formed by ion-implanting n-type impurities into the semiconductor substrate constituting the n− type drift layer 1, and then diffusing the implanted n-type impurities into the semiconductor substrate being the n− type drift layer 1 by annealing.

A p-type base layer 15 is provided on the first main surface side of the n-type carrier storage layer 2. The p-type base layer 15 is in contact with the gate trench insulating film 11b of the active trench gate 11. An n+ type emitter layer 13 is provided in contact with the gate trench insulating film 11b of the active trench gate 11 on the first main surface side of the p-type base layer 15, and a p+ type contact layer 14 is provided in the remaining region. The n+ type emitter layer 13 and the p+ type contact layer 14 constitute the first main surface of the semiconductor substrate. The p+ type contact layer 14 is a region in which the concentration of p-type impurities is higher than that of the p-type base layer 15, and each of the p+ type contact layer 14 and the p-type base layer 15 may be separately referred to as it is when it is necessary to distinguish therebetween, and also the p+ type contact layer 14 and the p-type base layer 15 may be collectively referred to as a p-type base layer.

The semiconductor device 100 is provided with an n-type buffer layer 3 having a higher concentration of n-type impurities than that of the n− type drift layer 1 on the second main surface side of the n− type drift layer 1. The n-type buffer layer 3 of the semiconductor device 100 includes a first n-type buffer layer 3a and a second n-type buffer layer 3b. The first n-type buffer layer 3a is formed by implantation of protons (H+) and the second n-type buffer layer 3b is formed by implantation of phosphorus (P) or arsenic (As). The second n-type buffer layer 3b may not be provided, and only the first n-type buffer layer 3a may be provided. The n-type buffer layer 3 is provided to prevent punch-through of the depletion layer extending from the p-type base layer 15 to the second main surface side when the semiconductor device 100 is in the off state.

The semiconductor device 100 includes a high resistance layer 20 between the first n-type buffer layer 3a and the second n-type buffer layer 3b. The high resistance layer 20 is a layer having a resistivity higher than that of the drift layer. The thickness of the high resistance layer in the direction from the second main surface to the first main surface is 3 μm or more. When the second n-type buffer layer 3b is not provided, the high resistance layer 20 may be provided between the p-type collector layer 16 and the first n-type buffer layer 3a.

The semiconductor device 100 is provided with a p-type collector layer 16 on the lower side of the second n-type buffer layer 3b, and the lower surface of the p-type collector layer 16 constitutes the second main surface of the semiconductor substrate. The p-type collector layer 16 is provided not only in the cell region 10 but also in the terminal region 30, and the portion of the p-type collector layer 16 provided in the terminal region 30 constitutes the p-type terminal collector layer.

As illustrated in FIG. 3, in the semiconductor device 100, trenches are formed which extend through the p-type base layer 15 from the first main surface of the semiconductor substrate and reach the n− type drift layer 1. An active trench gate 11 is configured by providing the gate trench electrode 11a in the trench via the gate trench insulating film 11b. The gate trench electrode 11a faces the n− type drift layer 1 via the gate trench insulating film 11b. Further, the dummy trench gate 12 is configured by providing the dummy trench electrode 12a in the trench via the dummy trench insulating film 12b. The dummy trench electrode 12a faces the n− type drift layer 1 via the dummy trench insulating film 12b. The gate trench insulating film 11b of the active trench gate 11 is in contact with the p-type base layer 15 and the n+-type emitter layer 13. When a gate drive voltage is applied to the gate trench electrode 11a, a channel is formed in the p-type base layer 15 in contact with the gate trench insulating film 11b of the active trench gate 11.

As illustrated in FIG. 3, an interlayer insulating film 4 is provided on the gate trench electrodes 11a of the active trench gates 11. Barrier metal 5 is formed on the region where the interlayer insulating film 4 is not provided on the first main surface of the semiconductor substrate and on the interlayer insulating film 4. The barrier metal 5 may be, for example, a conductor containing titanium (Ti), for example, titanium nitride (TiN), or titanium silicide (TiSi), which is an alloy of titanium and silicon (Si).

As illustrated in FIG. 3, the barrier metal 5 is in ohmic contact with the n+ type emitter layer 13, the p+ type contact layer 14 and the dummy trench electrodes 12a, and is electrically connected to the n+ type emitter layer 13, the p+ type contact layer 14 and the dummy trench electrodes 12a. An emitter electrode 6 is provided on the barrier metal 5. The emitter electrode 6 may be formed of, for example, an aluminum alloy such as an aluminum silicon alloy (Al—Si based alloy), and may also be an electrode composed of metal films of a plurality of layers in which plating films are formed on the electrode formed of the aluminum alloy by electroless plating or electrolytic plating. The plating films formed by electroless plating or electrolytic plating may be, for example, nickel (Ni) plating films.

If the widths of contact holes 19 provided in the interlayer insulating film 4 are narrow and favorable embedding cannot be obtained with the emitter electrode 6, tungsten having more favorable embedding property than the emitter electrode 6 is placed in the contact holes 19 and then the emitter electrode 6 may be provided on tungsten. The emitter electrode 6 may be provided on the n+ type emitter layer 13, the p+ type contact layer 14, and the dummy trench electrodes 12a without providing the barrier metal 5. Further, the barrier metal 5 may be provided only on the n-type semiconductor layer such as the n+ type emitter layer 13. The barrier metal 5 and the emitter electrode 6 may be collectively referred to as an emitter electrode.

Although FIG. 3 illustrates a configuration in which the contact holes 19 are provided on the dummy trench electrodes 12a of the dummy trench gates 12 without the interlayer insulating film 4, the interlayer insulating film 4 may be formed on the dummy trench electrodes 12a of the dummy trench gates 12. When the interlayer insulating film 4 is formed on the dummy trench electrodes 12a of the dummy trench gates 12, the emitter electrode 6 and the dummy trench electrodes 12a need only be electrically connected in another cross section.

A collector electrode 7 is provided on the second main surface side of the p-type collector layer 16. As with the emitter electrode 6, the collector electrode 7 may be composed of an aluminum alloy or an aluminum alloy and plating films. Also, the collector electrode 7 may have a configuration different from the emitter electrode 6. The collector electrode 7 is in ohmic contact with the p-type collector layer 16 and is electrically connected to the p-type collector layer 16.

FIG. 4 is a cross-sectional view taken along the broken line B-B in FIG. 2 of the semiconductor device 100, and is a cross-sectional view of the cell region 10. The cross-sectional view taken along the broken line B-B of FIG. 4 is different from the cross-sectional view taken along the broken line A-A illustrated in FIG. 3 in that the n+ type emitter layer 13 provided on the first main surface side of the semiconductor substrate in contact with the active trench gates 11 is not shown. That is, as illustrated in FIG. 3, the n+ type emitter layer 13 is selectively provided on the first main surface side of the p-type base layer. The p-type base layer referred to here is a p-type base layer with which the p-type base layer 15 and the p+ type contact layer 14 are collectively referred to.

Next, a method of manufacturing the semiconductor device according to Embodiment 1 will be described. In the following description on the manufacturing method, the method of manufacturing the cell region will be described, and a method of manufacturing the terminal region 30 and the pad region 40 formed in an arbitrary structure is omitted.

Figure 10A:
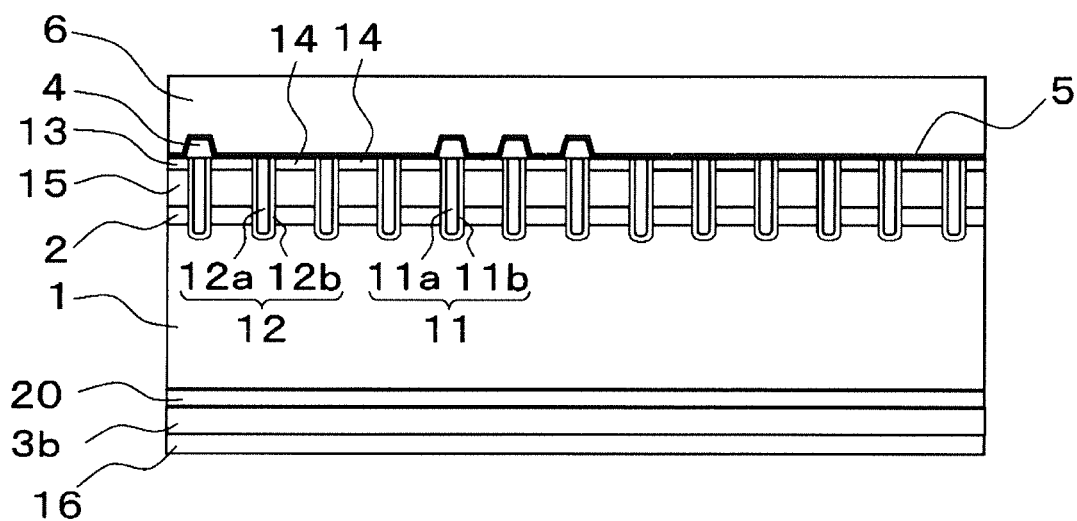
FIGS. 10A and 10B are diagrams illustrating the method of manufacturing the semiconductor device according to Embodiment 1.
Figure 10B:
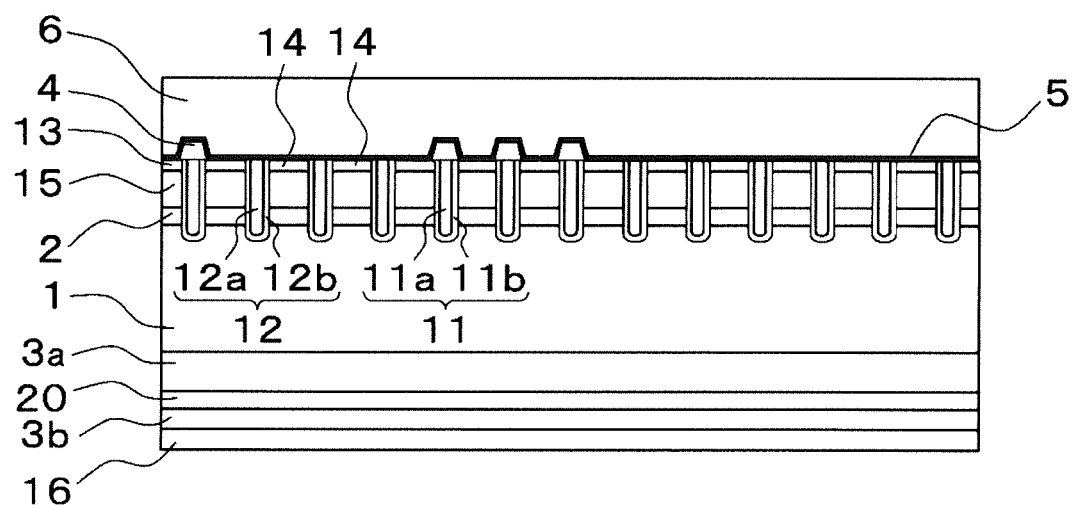
Figure 11:
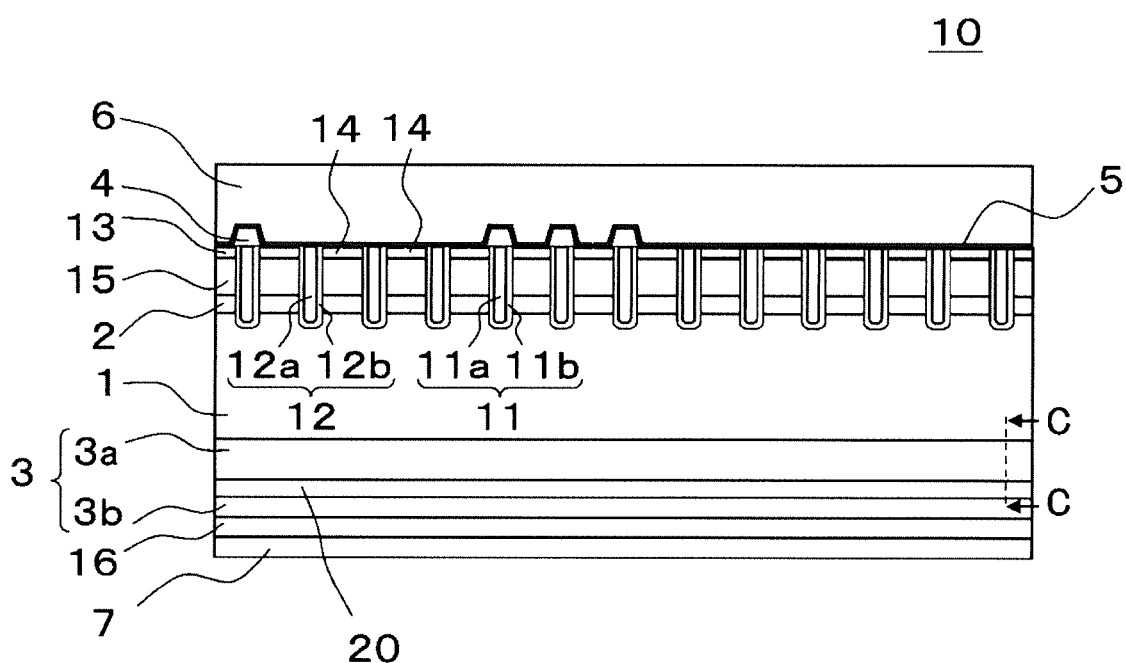
FIG. 11 is a diagram illustrating the method of manufacturing the semiconductor device according to Embodiment 1.

FIGS. 5A to 11 are diagrams illustrating the method of manufacturing the semiconductor device according to Embodiment 1, and illustrating a method manufacturing the semiconductor device 100. FIGS. 5A to 8B are diagrams illustrating a process of forming the front surface side of the semiconductor device 100, and FIGS. 9A and 11 are diagrams illustrating a process of forming the rear surface side of the semiconductor device 100.

Figure 5A:
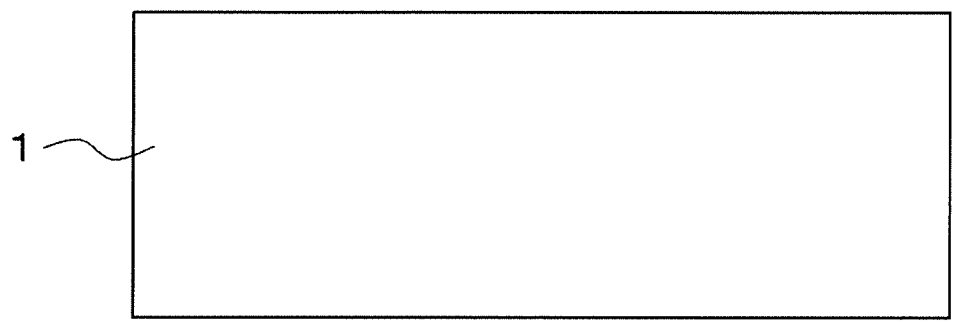
FIGS. 5A and 5B are diagrams illustrating a method of manufacturing the semiconductor device according to Embodiment 1.

First, as illustrated in FIG. 5A, a semiconductor substrate constituting the n– type drift layer 1 is prepared. For the semiconductor substrate, for example, a so-called FZ wafer manufactured by the Floating Zone (FZ) method or a so-called MCZ wafer manufactured by the Magnetic applied CZochralki (MCZ) method may be used, and an n-type wafer containing n-type impurities may be adopted. The concentration of n-type impurities contained in the semiconductor substrate is appropriately selected depending on the withstand voltage of the semiconductor device to be manufactured. As illustrated in FIG. 5A, in the process of preparing the semiconductor substrate, the entire semiconductor substrate is the n– type drift layer 1, and p-type or n-type impurity ions are implanted from the first main surface side or the second main surface side of such a semiconductor substrate and diffused in the semiconductor substrate by heat treatment or the like to form a p-type or n-type semiconductor layer; thereby, the semiconductor device 100 is manufactured.

Further, although not illustrated, a region serving as a terminal region 30 is provided around the cell region. Hereinafter, although the method of manufacturing the semiconductor device 100 will be mainly described, the terminal region 30 of the semiconductor device 100 may be manufactured by a well-known manufacturing method. For example, when forming an FLR having a p-type terminal well layer as a withstand voltage holding structure in the terminal region 30, it may be formed by implanting p-type impurity ions before processing the cell region 10 of the semiconductor device 100, and it may also be formed by implanting p-type impurity ions at the same time as the p-type impurity ions are implanted into the cell region 10 of the semiconductor device 100.

Figure 5B:
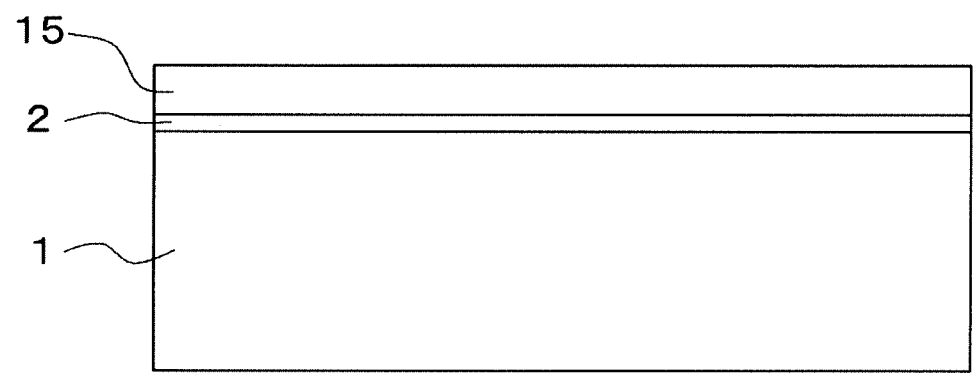

Next, as illustrated in FIG. 5B, n-type impurities such as phosphorus (P) are implanted from the first main surface side of the semiconductor substrate to form the n-type carrier storage layer 2. Further, p-type impurities such as boron (B) are implanted from the first main surface side of the semiconductor substrate to form the p-type base layer 15. The n-type carrier storage layer 2 and the p-type base layer 15 are formed by implanting impurity ions into the semiconductor substrate and then diffusing the impurity ions by heat treatment. The n-type impurities and the p-type impurities are ion-implanted after masking the first main surface of the semiconductor substrate; therefore, the n-type carrier storage layer 2 and the p-type base layer 15 are selectively formed on the first main surface side of the semiconductor substrate. The n-type carrier storage layer 2 and the p-type base layer 15 are formed in the cell region 10 and are connected to the p-type terminal well layer at the terminal region 30. Masking is a treatment to form a mask on the semiconductor substrate in which a resist is applied on a semiconductor substrate to form an opening in a predetermined region of the resist by using a photomechanical process technique, and ion implantation or etching is performed in the predetermined region of the semiconductor substrate through the opening. In the p-type base layer 15, the depth and p-type impurity concentration of the p-type base layer 15 may be constant. In the case of such a configuration, simultaneously performable ion implantation improves the productivity of the semiconductor device. Further, the p-type base layer 15 has the constant depth; therefore, relaxation of the electric field concentration and suppression of the decrease in withstand voltage are ensured. The depth and the concentration of the p-type impurities of the p-type base layer 15 may be made different by ion-implanting the p-type impurities into the p-type base layer 15 separately by masking.

Figure 6A:
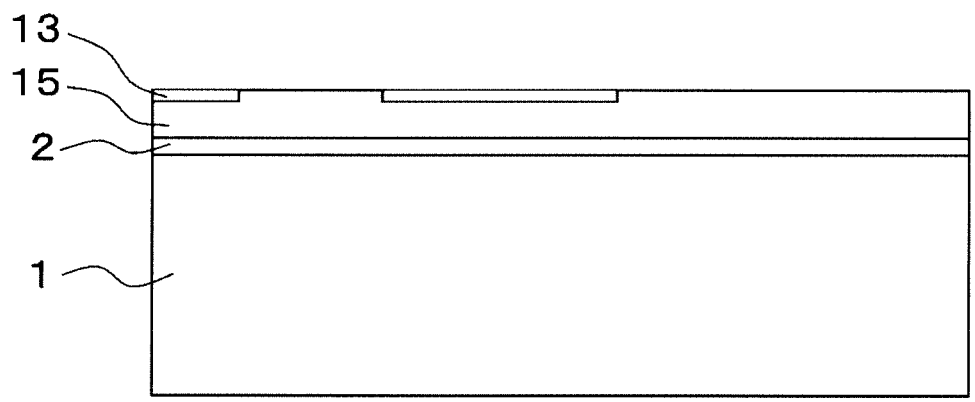
FIGS. 6A and 6B are diagrams illustrating the method of manufacturing the semiconductor device according to Embodiment 1.

Next, as illustrated in FIG. 6A, n-type impurities are selectively implanted into the first main surface side of the p-type base layer 15 by masking to form the n+ type emitter layer 13. The n-type impurities to be implanted may be, for example, arsenic (As) or phosphorus (P).

Figure 6B:
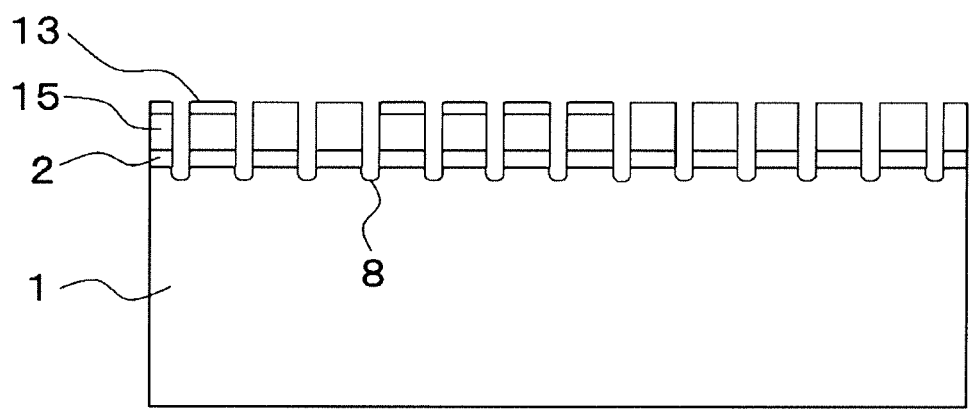

Next, as illustrated in FIG. 6B, trenches 8 are formed which penetrate the p-type base layer 15 from the first main surface side of the semiconductor substrate and reach the n– type drift layer 1. The side wall of a trench 8 penetrating the n+ type emitter layer 13 forms a part of the n+ type emitter layer 13. The trench 8 may be formed by, after an oxide film such as silicon dioxide ($SiO_2$) is deposited on the semiconductor substrate, forming an opening in an oxide film at the portion where the trench 8 is to be formed by masking, and etching the semiconductor substrate with the oxide film having the opening is used as a mask. In FIG. 6B, although the trenches 8 are formed at constant pitch, the trenches 8 may have a varied pitch. The pattern of the pitch of the trenches 8 in plan view can be appropriately changed by the mask pattern for masking.

Figure 7A:
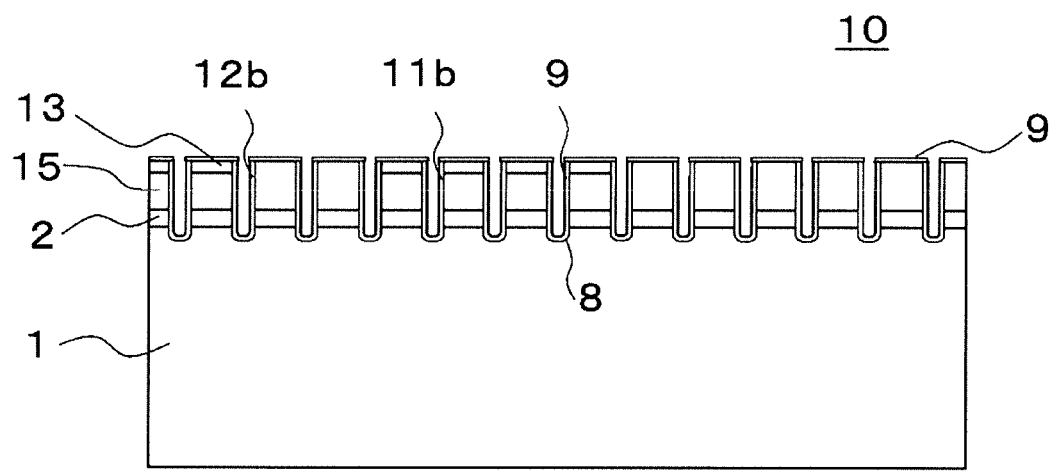
FIGS. 7A and 7B are diagrams illustrating the method of manufacturing the semiconductor device according to Embodiment 1.

Next, as illustrated in FIG. 7A, the semiconductor substrate is heated in an atmosphere containing oxygen to form an oxide film 9 on the inner walls of the trenches 8 and the first main surface of the semiconductor substrate. Of the oxide film 9 formed on the inner wall of the trench 8, portions of the oxide film 9 formed in the trenches 8 of the cell region 10 are the gate trench insulating films 11b of the active trench gate 11 and the dummy trench insulating films 12b of the dummy trench gate 12. The oxide film 9 formed on the first main surface of the semiconductor substrate is removed in a later step.

Figure 7B:
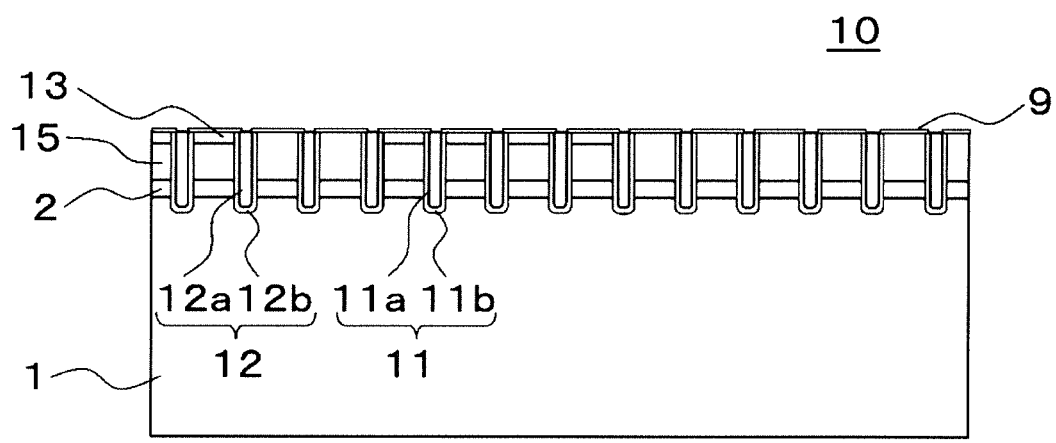

Next, as illustrated in FIG. 7B, polysilicon doped with n-type or p-type impurities is deposited in the trenches 8 in which the oxide film 9 is formed on inner walls thereof by chemical vapor deposition (CVD) or the like, and the gate electrodes 11a and the dummy trench electrodes 12a are formed.

Figure 8A:
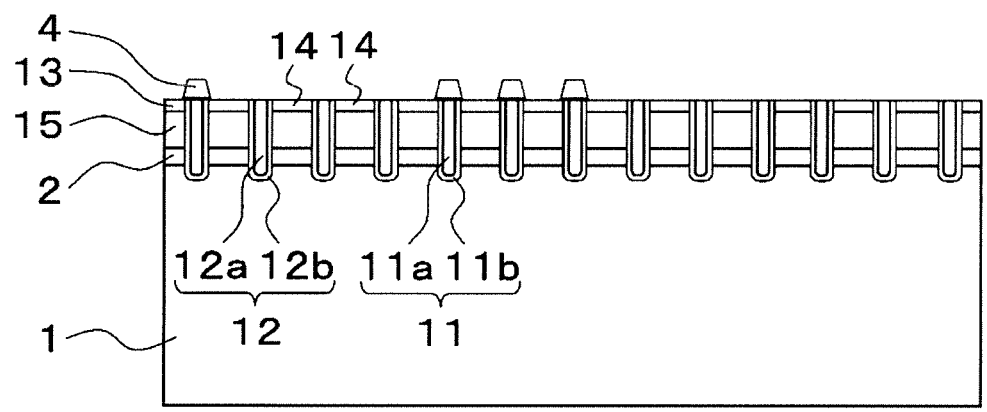
FIGS. 8A and 8B are diagrams illustrating the method of manufacturing the semiconductor device according to Embodiment 1.

Next, as illustrated in FIG. 8A, the interlayer insulating film 4 is formed on the gate trench electrodes 11a of the active trench gates 11, and then the oxide film 9 formed on the first main surface of the semiconductor substrate is removed. The interlayer insulating film 4 may be, for example, silicon dioxide ($SiO_2$). Then, contact holes are formed in the interlayer insulating film 4 deposited by masking. The contact holes are formed on the n+ type emitter layer 13, the p+ type contact layer 14, and the dummy trench electrodes 12a.

Figure 8B:
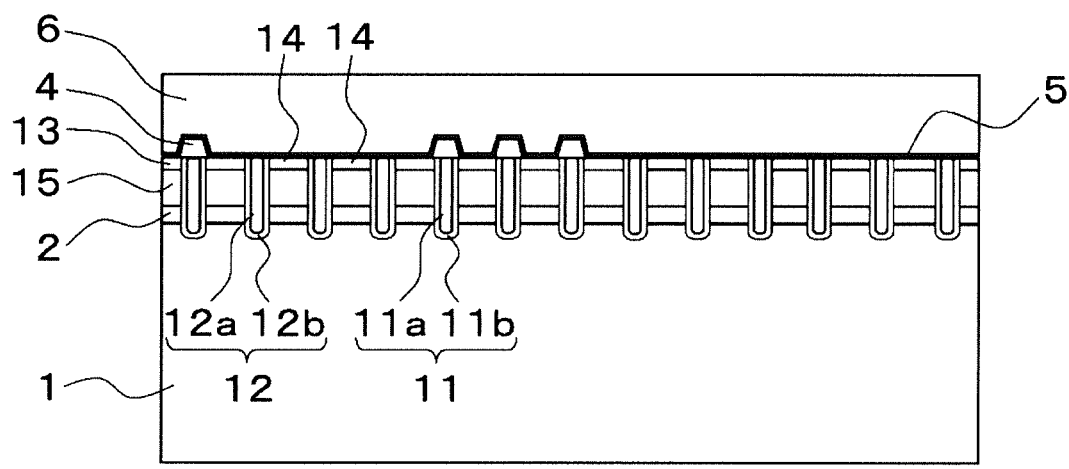

Next, as illustrated in FIG. 8B, the barrier metal 5 is formed on the first main surface of the semiconductor substrate and the interlayer insulating film 4, and the emitter electrode 6 is further formed on the barrier metal 5. The barrier metal 5 is formed by forming a film of titanium, titanium nitride, or the like by Physical Vapor Deposition (PVD) or CVD.

The emitter electrode 6 may be formed by depositing an aluminum-silicon alloy (Al—Si based alloy) on the barrier metal 5 by, for example, PVD such as sputtering or vapor deposition. Further, a nickel alloy (Ni alloy) may further be formed on the formed aluminum-silicon alloy by electroless plating or electrolytic plating to form the emitter electrode 6. When the emitter electrode 6 is formed by plating, a thick metal film can be easily formed as the emitter electrode 6, so that the heat capacity of the emitter electrode 6 can be increased and the heat resistance is improved. When the emitter electrode 6 consisting of an aluminum-silicon alloy is formed by PVD and then the nickel alloy is further formed by plating, the plating for forming the nickel alloy may be performed after the processing of the second main surface side of the semiconductor substrate is performed.

Next, the second main surface side of the semiconductor substrate is ground to thin the semiconductor substrate to the designed predetermined thickness. The thickness of the semiconductor substrate after grinding may be, for example, 80 μm to 200 μm.

Figure 9A:
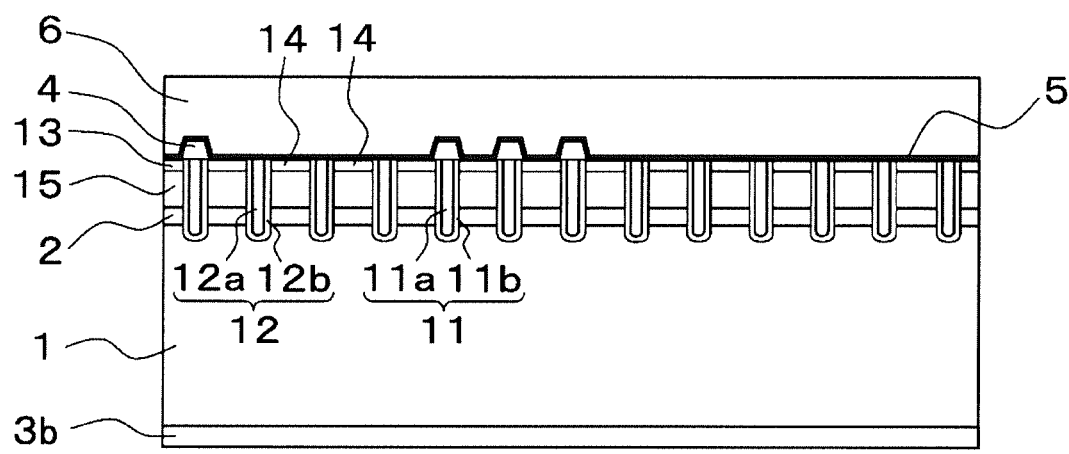
FIGS. 9A and 9B are diagrams illustrating the method of manufacturing the semiconductor device according to Embodiment 1.

Next, as illustrated in FIG. 9A, n-type impurities are implanted from the second main surface side of the semiconductor substrate to form a second n-type buffer layer 3b. The second n-type buffer layer 3b is formed by implanting phosphorus (P) ions. The acceleration energy of phosphorus ion implantation is 1000 keV or less, and the implantation amount of phosphorus is $1\times10^{12}$ $cm^{-2}$ or more and $1\times10^{13}$ $cm^{-2}$ or less. The second n-type buffer layer 3b may be formed by implanting arsenic (As) ions.

Figure 9B:
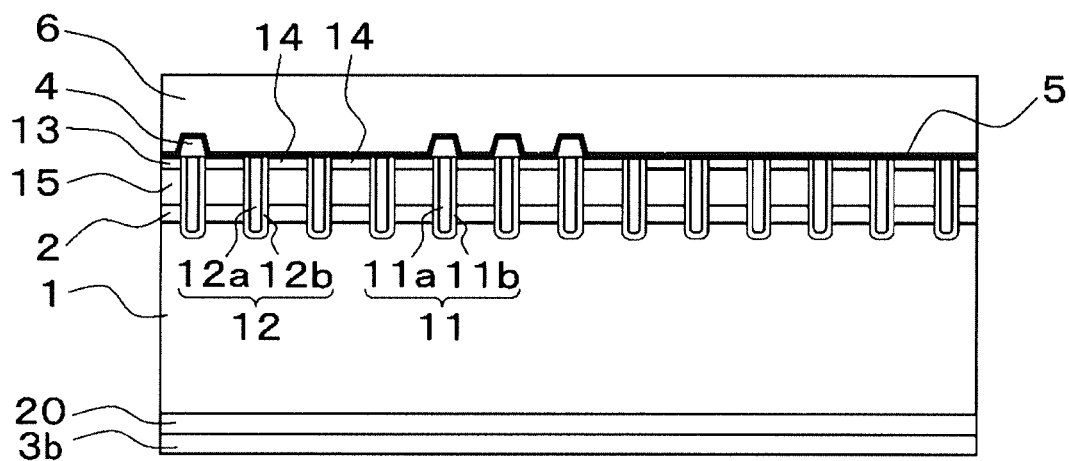

Next, as illustrated in FIG. 9B, n-type impurities are implanted from the second main surface side of the semiconductor substrate to form a high resistance layer 20. The high resistance layer 20 is formed by implanting protons (H+). Phosphorus implanted into the semiconductor substrate when the second buffer layer 3b is provided has a larger atomic radius than protons, and implantation damages occur in large numbers due to collision of atomic nuclei at the time of implantation; therefore, overlapping the phosphorus implantation profile with the proton implantation profile can affect proton donorization. For example, when the acceleration energy of proton implantation is 400 keV or less, the implantation profiles of phosphorus and protons overlap, and a high resistance region is not formed. Therefore, the acceleration energy of proton implantation is set to exceed 400 keV, and mutual interference is prevented by adjusting the implantation positions of phosphorus and protons. Either phosphorus or protons may be implanted first, and the protons may be implanted first and then phosphorus may be implanted.

Further, phosphorus can have a higher activation rate as n-type impurities than protons; therefore, punch-through of the depletion layer is reliably prevented even with a semiconductor substrate thinned by forming the second n-type buffer layer 3b with phosphorus.

Next, as illustrated in FIG. 10A, p-type impurities are implanted from the second main surface side of the semiconductor substrate to form the collector layer 16. The p-type collector layer 16 may be formed by implanting boron (B), for example. The p-type collector layer 16 is also formed in the terminal region 30 to be a p-type terminal collector layer.

Next, as illustrated in FIG. 10B, the first buffer layer 3a is formed by performing a heat treatment on the impurities implanted from the second main surface side of the semiconductor substrate. Impurities implanted into the p-type collector layer and the n-type buffer layer 3b are also diffused and activated at the same time. In the heat treatment step, the implanted impurities are activated by irradiating the second main surface with a laser, that is, laser annealing is performed. The first buffer layer 3a is formed by diffusing the impurities by heat treatment and having a resistivity lower than that of the drift layer. At this time, the n-type impurities are not diffused between the first buffer layer 3a and the second buffer layer 3b, and the resistivity of the high resistance layer 20 is set to be higher than that of the drift layer.

Crystal defects are formed in the proton passage region at the time of proton implantation, and the crystal defects remain after the heat treatment step to form the high resistance layer 20. This is because the small amount of protons remaining in the proton passage region, so that the protons, which are n-type impurities, are not diffused and are not activated during the heat treatment step, resulting in high resistance. On the other hand, depending on the position where the protons are implanted, the amount of protons is larger than that of the high resistance layer 20, so that the first buffer layer 3a can be formed during the heat treatment step. That is, in the heat treatment step, the high resistance layer 20 having a resistivity higher than that of the drift layer and the first buffer layer 3a having a resistivity lower than that of the drift layer can be formed at the same time. The first n-type buffer layer 3a and the high resistance layer 20 may be formed in the cell region 10 and the terminal region 30, or may be formed only in the cell region 10.

With such a manufacturing method, the lifetime of holes is controlled without irradiating electron beams from the front surface to the rear surface of the semiconductor device, and a buffer layer is formed, so that the manufacturing process is simplified and manufacturing efficiency is improved. Further, irradiation of electron beam from the front surface of the semiconductor device is not required; therefore, variations in the electrical characteristics of the cell region are prevented because the electron beam does not pass through the front surface.

The protons being impurities implanted from the second main surface side of the semiconductor substrate, are activated at an annealing temperature of 350° C. or higher and 450° C. or lower; therefore, attention has to pay regarding the temperature of the entire semiconductor substrate not becoming higher than the annealing temperature except in the step for activating the protons, after the proton implantation.

In addition, protons can be implanted from the second main surface of the semiconductor substrate to a deeper position with relatively low acceleration energy, and the depth of proton implantation can be changed relatively easily by changing the acceleration energy. Therefore, when the buffer layer is formed by protons, by implanting a plurality of times while changing the acceleration energy, a buffer layer having a width wider in the thickness direction of the semiconductor substrate than that formed by phosphorus is formed. This configuration will be described in Modification described later.

Next, as illustrated in FIG. 11, the collector electrode 7 is formed on the second main surface of the semiconductor substrate. The collector electrode 7 is formed over the entire surface of the cell region 10 and the terminal region 30 on the second main surface. The collector electrode 7 may be formed by depositing an aluminum silicon alloy (Ai-Si based alloy), titanium (Ti) or the like, by PVD such as sputtering or vapor deposition, or may be formed by laminating a plurality of types of metals such as an aluminum silicon alloy, titanium, nickel, gold. Further, a metal film may be further formed by electroless plating or electrolytic plating on the metal film formed by PVD to form the collector electrode 7.

The semiconductor device 100 is manufactured through the above steps. A plurality of semiconductor devices 100 are manufactured in a matrix on one n-type wafer: therefore, the semiconductor device 100 is completed by cutting into individual semiconductor devices 100 by laser dicing or blade dicing.

Next, in order to explain the high resistance layer 20 of the semiconductor device 100 according to Embodiment 1, a semiconductor device of a comparative example will be described first.

Figure 12:
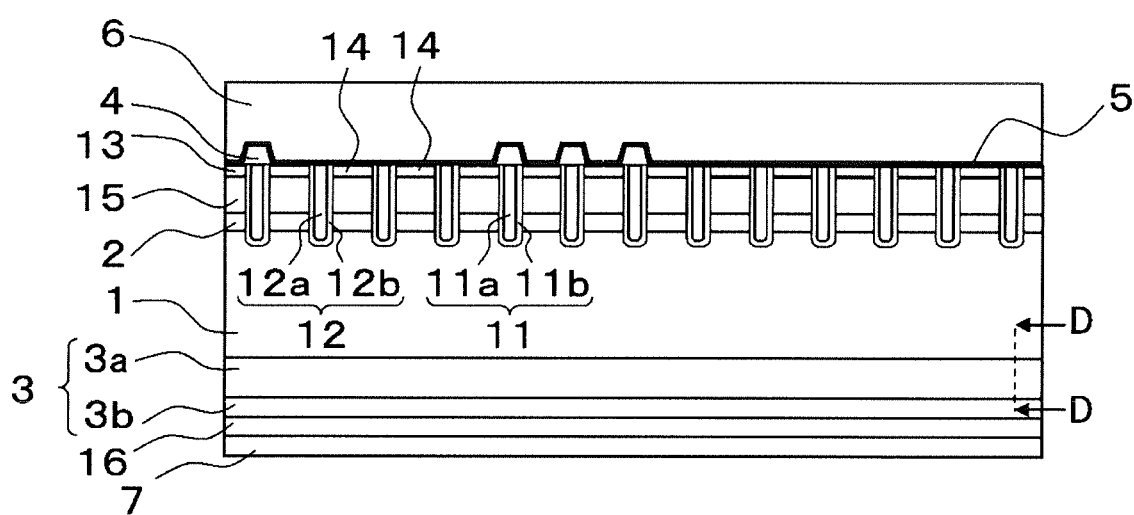
FIG. 12 is a diagram illustrating a semiconductor device of a comparative example.

FIG. 12 is a diagram illustrating a semiconductor device of a comparative example. The semiconductor device of the comparative example is different from the semiconductor device 100 of Embodiment 1 in that the high resistance layer 20 is not provided between the first buffer layer 3a and the second buffer layer 3b. That is, in the semiconductor device of the comparative example, the first buffer layer 3a and the second buffer layer 3b are provided adjacent to each other.

Figure 13:
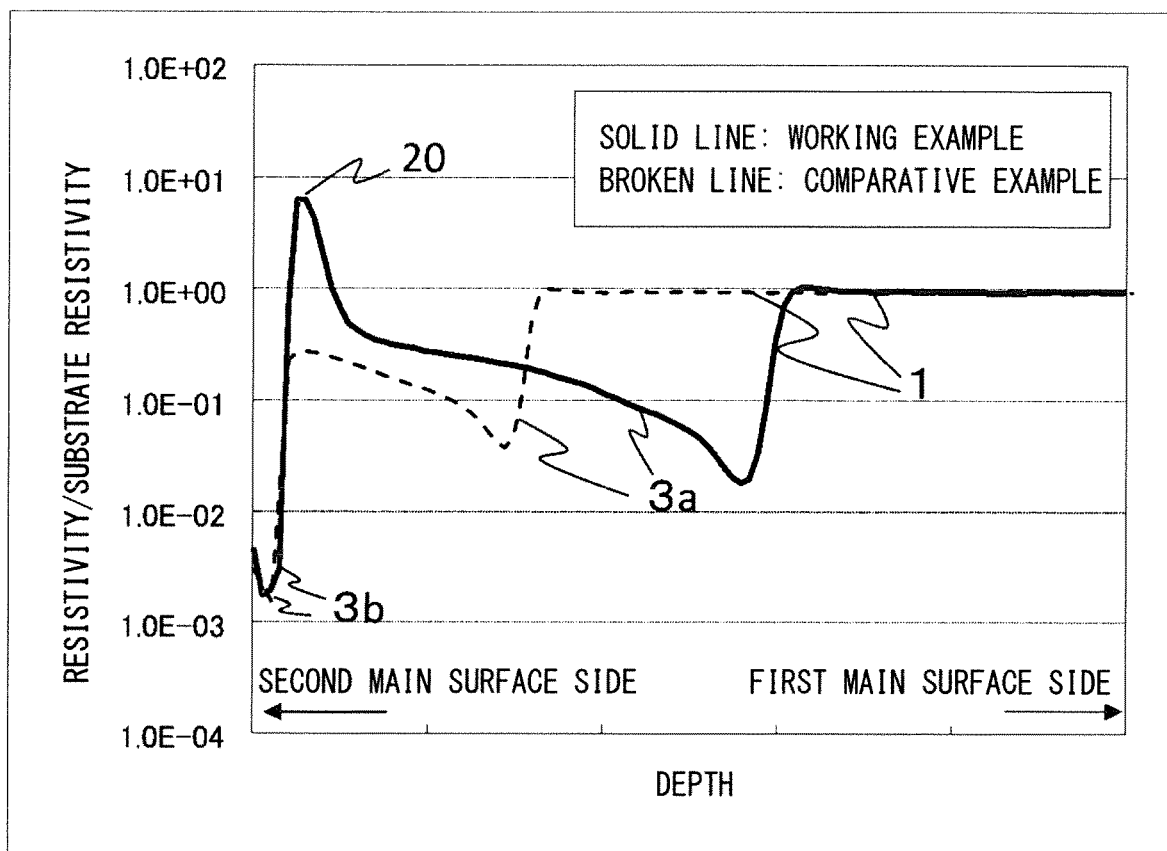
FIG. 13 is a graph illustrating the resistivity distribution between the semiconductor device of the comparative example and the semiconductor device according to Embodiment 1.

FIG. 13 is a graph illustrating the resistivity distribution between the semiconductor device of the comparative example and the semiconductor device 100 according to Embodiment 1, and illustrating the Spreading Resistance (SR) profile. The working example illustrated by the solid line in FIG. 13 is the resistivity distribution in the broken line C-C of the semiconductor device 100 illustrated in FIG. 11, and the comparative example illustrated by the broken line in FIG. 13 is the resistivity distribution in the broken line D-D of the semiconductor device illustrated in FIG. 12. In the high resistance layer 20, the resistivity is greater than the substrate resistivity. That is, the high resistance layer 20 is a region in which the resistivity ratio with the resistivity of the semiconductor substrate is one or more. In terms of ranges of resistivity, the resistivity of the high resistance layer 20 is 10 Ωcm to 1000 Ωcm, the resistivity of the semiconductor substrate is 10 Ωcm to 100 Ωcm, the resistivity of the first buffer layer 3a is 1 Ωcm to 10 Ωcm, and the resistivity of the second buffer layer 3b is 0.1 Ωcm to 1 Ωcm.

Figure 14:
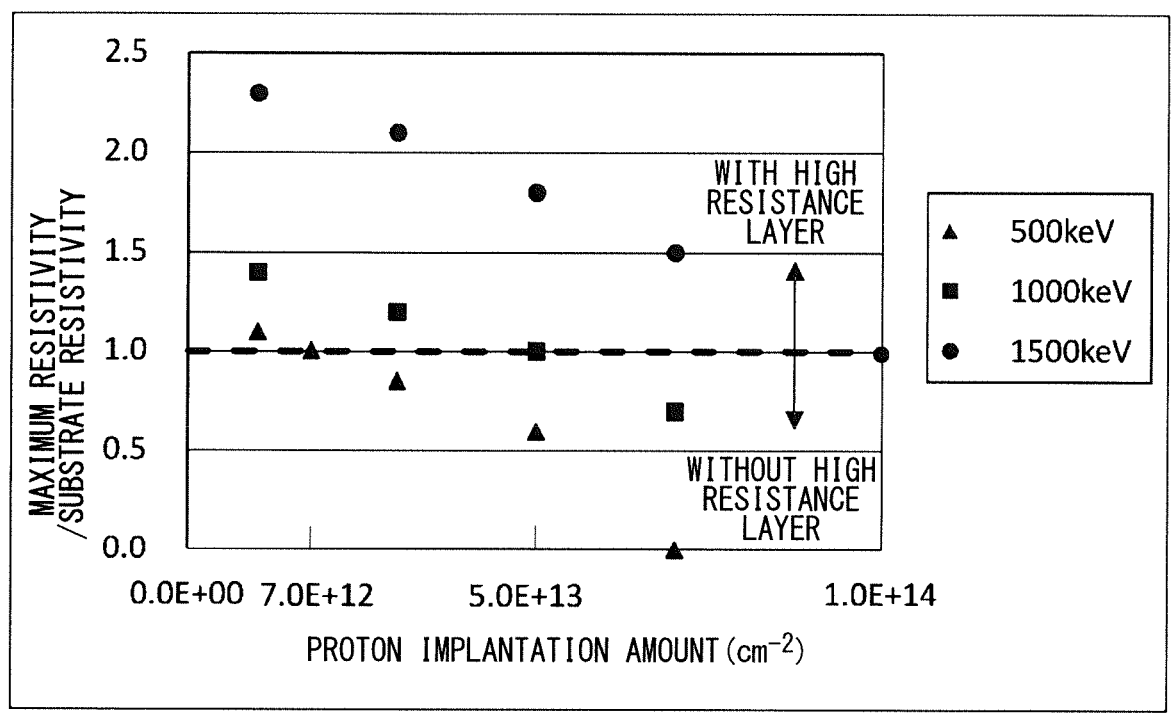
FIG. 14 is a graph illustrating a relationship between a resistivity ratio with a substrate and a proton implantation amount.

FIG. 14 is a graph illustrating a relationship between a resistivity ratio with a proton implantation amount. The maximum resistivity in FIG. 14 is the value having the maximum resistivity in the resistivity distribution in the broken line C-C of the semiconductor device 100 illustrated in FIG. 11. FIG. 14 illustrates the relationship between the proton implantation amount and the acceleration energy at the time of implantation when the high resistance layer is formed.

When protons being n-type impurities are implanted into a semiconductor device, crystal defects are formed in the proton passage region. The remaining proton amount in the proton passage region is small; therefore, the protons are less prone to be diffused and activated in the heat treatment step. Accordingly, the high resistance layer 20 is formed by crystal defects being left even after the heat treatment step.

However, depending on the proton implantation amount, the width of the buffer layer having a resistivity lower than that of the semiconductor substrate may change during the heat treatment step, and the high resistance layer 20 is possibly not be formed. For example, as the proton implantation amount increases, protons are more prone to be diffused and activated during the heat treatment step, so that the first buffer layer 3a having a resistivity lower than that of the semiconductor substrate is formed with greater width. Therefore, in order to form the high resistance layer 20 between the second main surface and the first buffer layer 3a of the semiconductor substrate, the protons are required to be implanted in deeper position from the second main surface side as the proton implantation amount increases. That is, depending on the proton implantation amount, when protons are implanted from the second main surface side to a shallow position, crystal defects do not remain because the protons are diffused and activated from the position where the protons were implanted to the proton passage region during the heat treatment step, so that the high resistance layer 20 is not formed. Therefore, the implantation position is adjusted by changing the acceleration energy for implanting protons.

The proton range is about 6 μm at 500 keV and about 30 μm at 1500 keV, and the larger the acceleration energy, the deeper the protons can be implanted. For example, when the acceleration energy of proton implantation is 500 keV or more and the proton implantation amount is less than $7 \times 10^{12}$ cm$^{-2}$, a high resistance layer is formed. Also, when the acceleration energy of proton implantation is 1000 keV or more and the proton implantation amount is less than $5 \times 10^{13}$ cm$^{-2}$, a high resistance layer is formed. Further, when the acceleration energy of proton implantation is 1500 keV or more and the proton implantation amount is less than $1 \times 10^{14}$ cm$^{-2}$, a high resistance layer is formed.

Even if the proton implantation amount exceeds the range illustrated in FIG. 14 and becomes as large as $3 \times 10^{15}$ cm$^{-2}$, a high resistance layer is formed when the acceleration energy exceeds 2000 keV. Certainly, even if with less than $3 \times 10^{15}$ cm$^{-2}$, if the acceleration energy is 2000 keV or more, protons can be implanted deep from the second main surface side; therefore, a high resistance layer 20 can be formed between the first buffer layer 3a and the second main surface.

Figure 15:
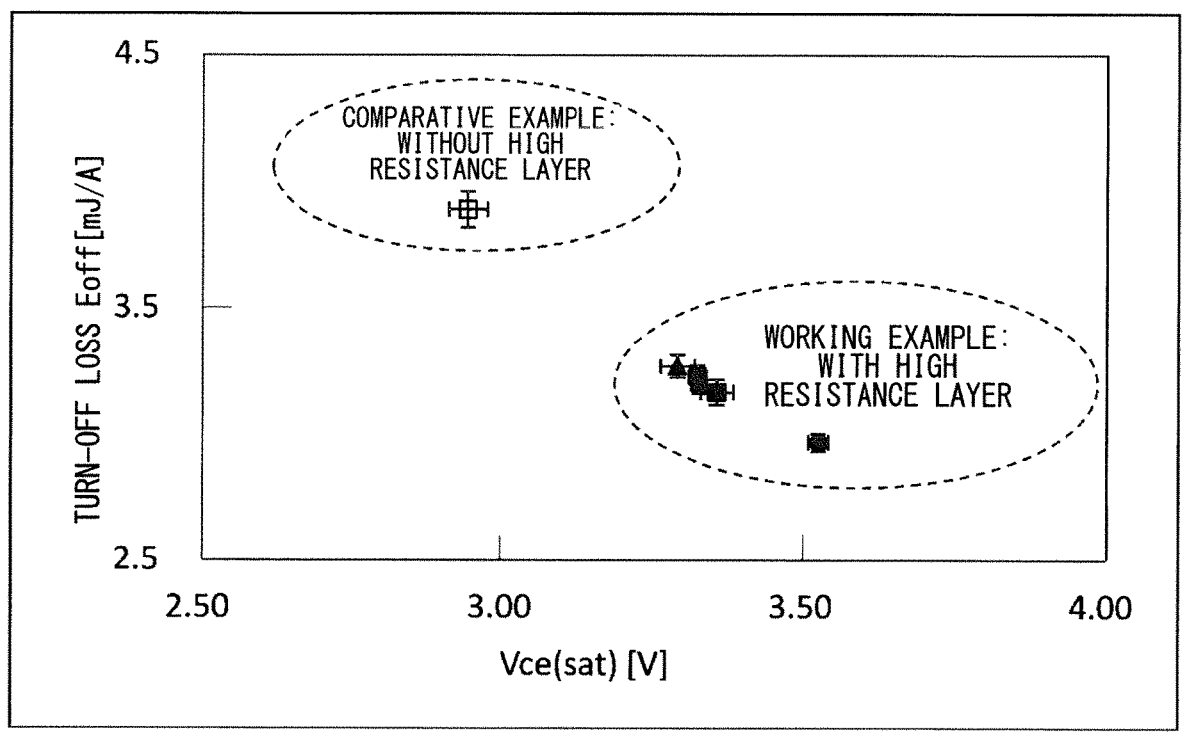
FIG. 15 is a graph illustrating a relationship between the turn-off loss and the collector-emitter voltage of the semiconductor device of the comparative example and the semiconductor device according to Embodiment 1.

FIG. 15 is a graph illustrating a relationship between the turn-off loss and the collector-emitter saturation voltage Vce (sat) of the semiconductor device 100 of the comparative example and the semiconductor device according to Embodiment 1.

From FIG. 15, it can be seen that the turn-off loss is suppressed in the working example as compared with the comparative example. This is because the high resistance layer 20 including crystal defects captures holes being carriers, and eliminates the holes by recombination with electrons, so that the lifetime of the holes can be shortened. That is, the high resistance layer 20 is provided in the working example as compared with the comparative example; therefore, the switching speed can be increased as the disappearance of holes quickens, and the switching loss can be suppressed.

The high resistance layer 20 is preferably formed near the collector layer 16. With such a configuration, the high resistance layer 20 can easily capture the holes moving from the collector layer 16, so that the switching loss can be further suppressed.

In the semiconductor device according to Embodiment 1, by providing the high resistance layer 20 between the second main surface and the first buffer layer 3a of the semiconductor substrate, the lifetime of holes is controlled and the switching loss can be suppressed.

Further, according to the method of manufacturing a semiconductor device according to Embodiment 1, impurities are implanted in the depth direction from the second main surface to the first main surface of the semiconductor substrate, and the high resistance layer 20 and the buffer layer 3a are subjected to the heat treatment step to simultaneously be formed; therefore, the manufacturing efficiency is improved.

<Modification>

Figure 16:
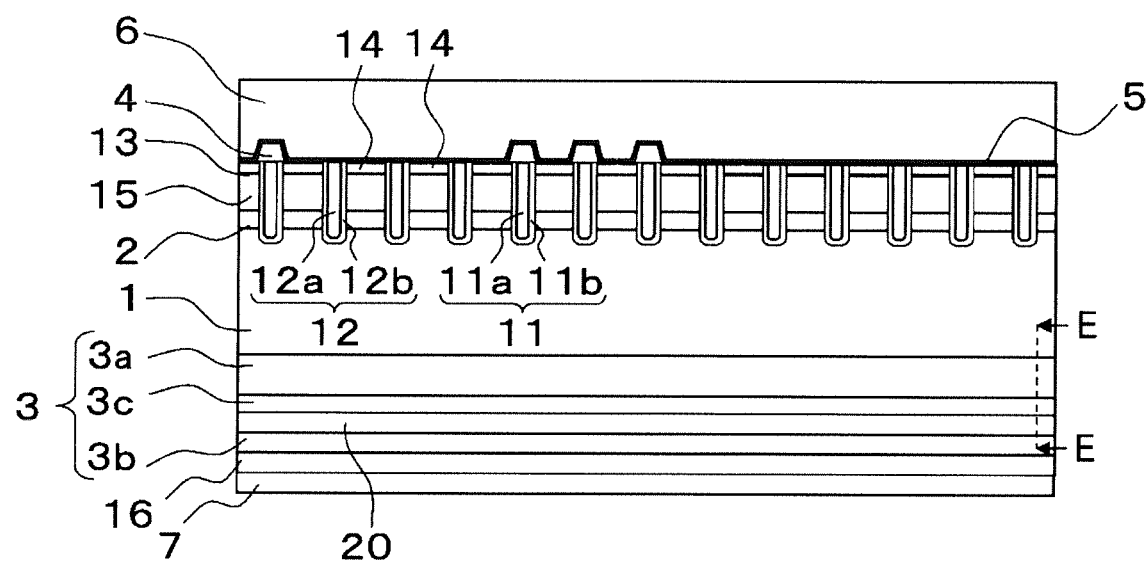
FIG. 16 is a diagram illustrating a semiconductor device according to Modification of Embodiment 1.

The configuration of the semiconductor device according to Modification of Embodiment 1 will be described with reference to FIG. 16. FIG. 16 is a diagram illustrating a semiconductor device according to Modification of Embodiment 1. In Modification of Embodiment 1, the same components as those described in Embodiment 1 are denoted by the same reference numerals and the description thereof will be omitted.

Figure 17:
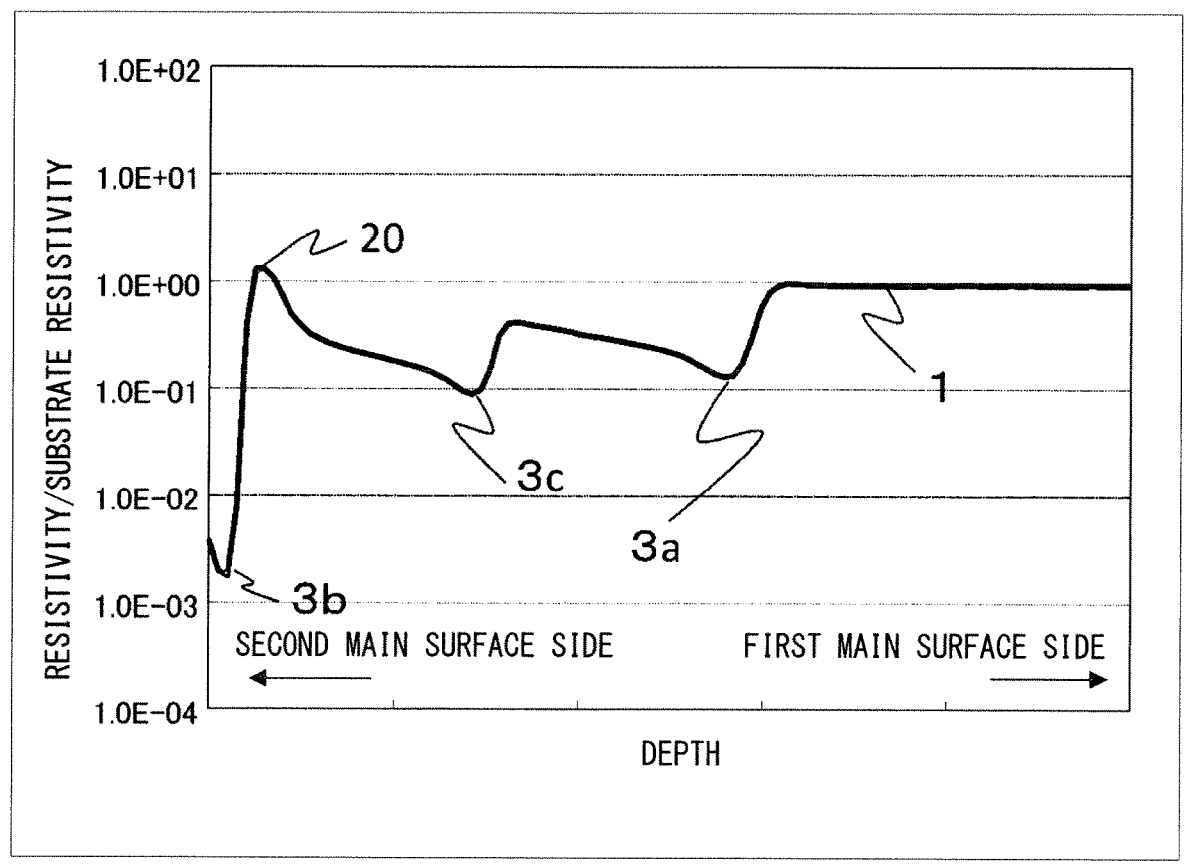
FIG. 17 is a graph illustrating the resistivity distribution of the semiconductor device according to Modification of Embodiment 1.

As illustrated in FIG. 16, the n-type buffer layer 3 of the semiconductor device of Modification includes a third n-type buffer layer 3c in addition to the configuration of Embodiment 1, and the third n-type buffer layer 3c is formed by implanting protons (H+). FIG. 17 is a graph illustrating the resistivity distribution of the semiconductor device according to Modification of Embodiment 1, and illustrating the Spreading Resistance (SR) profile. Modification of FIG. 17 is the resistivity distribution in the broken lines E-E of the semiconductor device illustrated in FIG. 16. The semiconductor device of Modification includes the third n-type buffer layer 3c; therefore, there are a plurality of resistivity bottoms between the high resistance layer 20 and the first main surface. With such a configuration, by providing the high resistance layer 20 between the second main surface and the buffer layer of the semiconductor substrate in FIG. 17, the lifetime of holes is controlled and the switching loss can be suppressed. The third n-type buffer layer 3c is included in Modification, in addition to this, by providing more n-type buffer layers, there may be more resistivity bottoms between the high resistance layer 20 and the first main surface.

Embodiment 2

Figure 18:
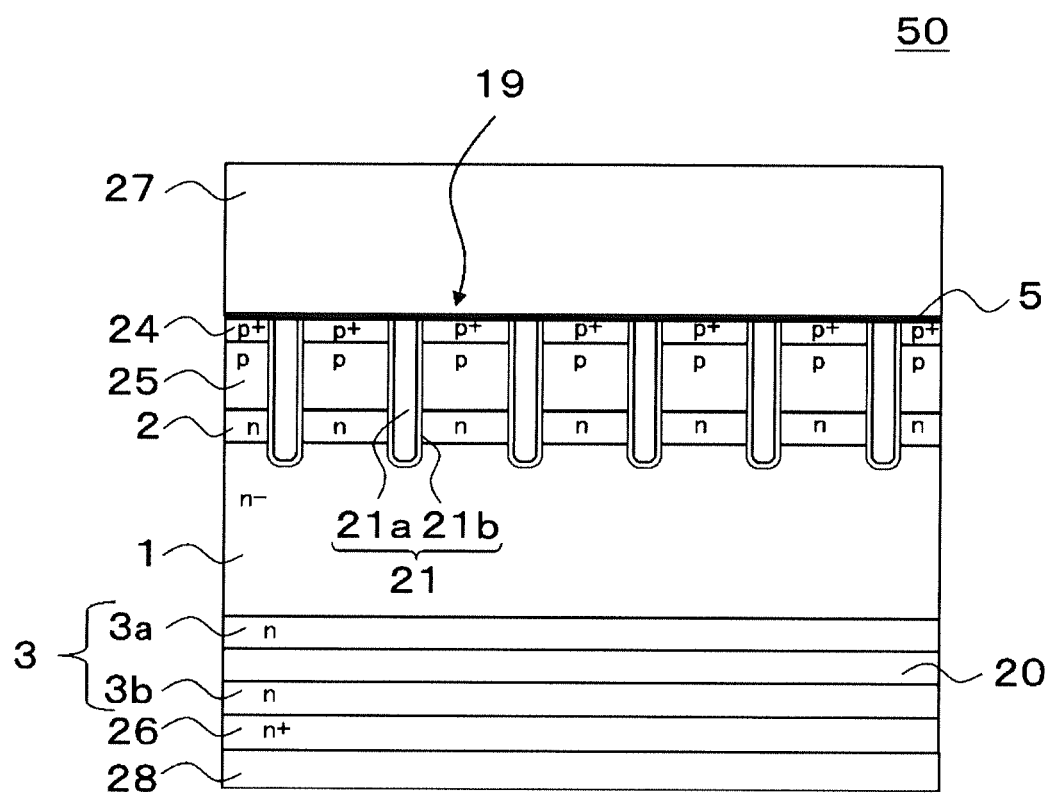
FIG. 18 is a diagram illustrating a semiconductor device according to Embodiment 2.

A configuration of a semiconductor device according to Embodiment 2 will be described with reference to FIG. 18. FIG. 18 is a diagram illustrating a semiconductor device according to Embodiment 2. In Embodiment 2, the same components as those described in Embodiment 1 are denoted by the same reference numerals and the description thereof will be omitted.

As illustrated in FIG. 18, the semiconductor device of Embodiment 2 is different from the semiconductor device of Embodiment 1 in that the semiconductor device of Embodiment 2 includes a diode. In FIG. 18, the semiconductor substrate ranges from the p+ type contact layer 24 to the n+ type cathode layer 26. In FIG. 18, the upper end of the p+ type contact layer 24 in the sheet of drawing paper is referred to as a first main surface of the semiconductor substrate, and the lower end of the n+ type cathode layer 26 in the sheet of drawing paper is referred to as a second main surface of the semiconductor substrate. The p+ type contact layer 24 does not necessarily have to be provided, and when the p+ type contact layer 24 is not provided, the p-type anode layer 25 is referred to as the first main surface of the semiconductor substrate.

As illustrated in FIG. 18, on the second main surface side of the n− type drift layer 1, a first n-type buffer layer 3a and a second n-type buffer layer 3b being a second n-type buffer layer 3 are provided in the same configuration as the semiconductor device of Embodiment 1.

During the recovery operation of the semiconductor device 50 of Embodiment 2, a negative voltage is applied to the anode electrode 27 as compared with the cathode electrode 28. The holes that have moved toward the n+ type cathode layer 26 during the forward operation change the movement direction toward the P-type anode layer 25 and move. However, at the timing of switching from the forward operation to the recovery operation, a portion of the holes having a lifetime longer than that of the electrons flows out to the outside of the semiconductor device via the anode electrode 27. Then, the recovery current flows due to the movement of the carriers, and a recovery loss occurs. The semiconductor device of Embodiment 2 is provided with the high resistance layer 20 between the second main surface and the first buffer layer 3a of the semiconductor substrate; therefore, carriers, in particular, being holes in the vicinity of the second main surface (rear surface) are captured, and the lifetime of holes is shortened by recombining with electrons. That is, in Embodiment 2, the switching loss can be suppressed by suppressing the recovery current due to the lifetime of the holes.

Therefore, in the semiconductor device according to Embodiment 2, by providing the high resistance layer 20 between the second main surface and the first buffer layer 3a of the semiconductor substrate, the lifetime of holes is controlled and the switching loss can be suppressed.

While Embodiments of the present disclosure have been shown and described in detail, the foregoing description is in all aspects illustrative and not restrictive. It is therefore understood that numerous modifications, replacement and variations can be devised without departing from the scope of the invention. Embodiment can be combined with other Embodiment.

What is claimed is:

1. A semiconductor device comprising:
   a semiconductor substrate having a drift layer of a first conductivity type between a first main surface and a second main surface opposite to the first main surface;
   a first buffer layer of the first conductive type provided between the drift layer and the second main surface in contact with the drift layer, having a resistivity lower than that of the drift layer, and having an impurity concentration higher than that of the drift layer; and a high resistivity layer provided between the first buffer layer and the second main surface and having a resistivity higher than that of the drift layer, wherein impurities of the first conductivity type of the first buffer layer are protons.

2. The semiconductor device according to claim 1, further comprising a second buffer layer of the first conductive type provided between the second main surface and the high resistance layer and having an impurity concentration higher than that of the drift layer.

3. The semiconductor device according to claim 2, wherein impurities of the first conductivity type of the second buffer layer are arsenic or phosphorus.

4. The semiconductor device according to claim 1, further comprising a collector layer of a second conductivity type provided on the second main surface side with respect to the high resistivity layer.

5. The semiconductor device according to claim 1, further comprising an anode layer of a second conductivity type provided in contact with the first main surface side of the drift layer and a cathode layer of the first conductivity type provided on the second main surface side with respect to the high resistivity layer.

6. The semiconductor device according to claim 1, wherein a thickness of the high resistance layer in a direction from the second main surface to the first main surface is 3 μm or more.

7. The semiconductor device according to claim 1, wherein a resistivity of the high resistivity layer is 10 Ωcm to 1000 Ωcm.

8. The semiconductor device according to claim 1, wherein a resistivity distribution curve indicating a resistivity of the first buffer layer at a depth from the second main surface to the first main surface has a plurality of resistivity bottoms.

9. A method of manufacturing a semiconductor device, comprising:

a step of preparing a semiconductor substrate having a drift layer of a first conductivity type between a first main surface and a second main surface opposite to the first main surface;

a first implantation step of performing implantation of first conductivity type impurities into the semiconductor substrate in a depth direction from the second main surface toward the first main surface; and a heat treatment step of forming a first buffer layer having a resistivity lower than that of the drift layer by diffusing the first conductivity type impurities, and forming, between the first buffer layer and the second main surface, a high resistivity layer having a resistivity higher than that of the drift layer without diffusing the first conductivity type impurities.

10. The method of manufacturing the semiconductor device according to claim 9, wherein first conductivity type impurities of the first buffer layer are protons.

11. The method of manufacturing the semiconductor device according to claim 10, wherein in the first implantation step, an acceleration energy is 500 keV or more and an implantation amount of the protons is less than $7 \times 10^{12}$ cm$^{-2}$.

12. The method of manufacturing the semiconductor device according to claim 11, wherein in the first implantation step, the acceleration energy is 1000 keV or more and the implantation amount of the protons is less than $5 \times 10^{13}$ cm$^{-2}$.

13. The method of manufacturing the semiconductor device according to claim 12, wherein in the first implantation step, the acceleration energy is 1500 keV or more and the implantation amount of the protons is less than $1 \times 10^{14}$ cm$^{-2}$.

14. The method of manufacturing the semiconductor device according to claim 13, wherein in the first implantation step, the acceleration energy is 2000 keV or more and the implantation amount of the protons is less than $3 \times 10^{15}$ cm$^{-2}$.

15. The method of manufacturing the semiconductor device according to claim 10, further comprising a second implantation step of forming a second buffer layer by implantation of first conductivity type impurities between the second main surface and the high resistivity layer.

16. The method of manufacturing the semiconductor device according to claim 15, wherein first conductivity type impurities of the second buffer layer are arsenic or phosphorus.

17. The method of manufacturing the semiconductor device according to claim 15, wherein in the second implantation step, first conductivity type impurities to be implanted into the second buffer layer is phosphorus, an acceleration energy is 1000 keV or less, and an implantation amount of phosphorus is $1 \times 10^{12}$ cm$^{-2}$ or more and $1 \times 10^{13}$ cm$^{-2}$ or less.

18. The method of manufacturing the semiconductor device according to claim 10, wherein a heat treatment temperature in the heat treatment step is 350° C. or more and 450° C. or less.

19. A semiconductor device comprising:

a semiconductor substrate having a drift layer of a first conductivity type between a first main surface and a second main surface opposite to the first main surface;

a first buffer layer of the first conductive type provided between the drift layer and the second main surface in contact with the drift layer, having a resistivity lower than that of the drift layer, and having an impurity concentration higher than that of the drift layer;

a high resistivity layer provided between the first buffer layer and the second main surface and having a resistivity higher than that of the drift layer; and an anode layer of a second conductivity type provided in contact with the first main surface side of the drift layer and a cathode layer of the first conductivity type provided on the second main surface side with respect to the high resistivity layer.

* * * * *